(12) United States Patent
White et al.

(10) Patent No.: US 9,705,201 B2
(45) Date of Patent: Jul. 11, 2017

(54) CAVITY-BACKED ARTIFICIAL MAGNETIC CONDUCTOR

(71) Applicant: HRL LABORATORIES LLC, Malibu, CA (US)

(72) Inventors: Carson R. White, Agoura Hills, CA (US); Daniel J. Gregoire, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/628,076

(22) Filed: Feb. 20, 2015

(65) Prior Publication Data

US 2015/0263432 A1  Sep. 17, 2015

Related U.S. Application Data

(63) Continuation-in-part of application No. 14/188,225, filed on Feb. 24, 2014.

(51) Int. Cl.
*H01Q 15/00* (2006.01)
*H01Q 15/14* (2006.01)
*H05K 1/16* (2006.01)

(52) U.S. Cl.
CPC ......... *H01Q 15/002* (2013.01); *H01Q 15/008* (2013.01); *H01Q 15/0066* (2013.01); *H01Q 15/142* (2013.01); *H01Q 15/148* (2013.01); *H05K 1/165* (2013.01); *H01Q 15/0013* (2013.01); *H05K 2203/08* (2013.01); *H05K 2203/162* (2013.01)

(58) Field of Classification Search
CPC ............. H01Q 15/002; H01Q 15/0066; H01Q 15/008; H01Q 15/142; H01Q 15/148

USPC ......................................................... 343/913
See application file for complete search history.

(56) References Cited

U.S. PATENT DOCUMENTS

| | | | |
|---|---|---|---|
| 4,234,960 A | | 11/1980 | Spilsbury |
| 4,242,685 A | * | 12/1980 | Sanford ................. H01Q 13/18 343/700 MS |
| 4,803,494 A | * | 2/1989 | Norris .................... H01Q 21/24 343/746 |
| 4,904,952 A | | 2/1990 | Tanimoto |

(Continued)

FOREIGN PATENT DOCUMENTS

| | | |
|---|---|---|
| CN | 101853974 A | 10/2010 |
| CN | 102005648 A | 4/2011 |

(Continued)

OTHER PUBLICATIONS

He, Xun-jun, Yue Wang, Zhao-xin Geng, Jian-min Wang and Tai-long Gui, "3D broadband isotropic NRI metamaterial based on metallic cross-pairs," Journal of Magnetism and Magnetic Materials, vol. 323, Issue 20, Oct. 2011, pp. 2425-2428.*

(Continued)

*Primary Examiner* — Dameon E Levi
*Assistant Examiner* — Jennifer F Hu
(74) *Attorney, Agent, or Firm* — Ladas & Parry

(57) ABSTRACT

An active artificial magnetic conductor includes an array of unit cells, each unit cell including a top face, at least one wall coupled to the top face, a base coupled to the at least one wall, and a crossed slot in the top face. The top face, the at least one wall, and the base form a cavity and are conductive.

27 Claims, 11 Drawing Sheets

(56) References Cited

U.S. PATENT DOCUMENTS

| | | | |
|---|---|---|---|
| 4,916,457 A * | 4/1990 | Foy | H01Q 21/064 343/768 |
| 5,392,002 A | 2/1995 | Delano | |
| 5,489,878 A | 2/1996 | Gilbert | |
| 6,081,167 A | 6/2000 | Kromat | |
| 6,121,940 A | 9/2000 | Skahill et al. | |
| 6,304,226 B1 * | 10/2001 | Brown | H01Q 13/18 343/767 |
| 6,411,261 B1 | 6/2002 | Lilly | |
| 6,476,771 B1 | 11/2002 | McKinzie | |
| 6,483,480 B1 * | 11/2002 | Sievenpiper | H01Q 3/44 343/700 MS |
| 6,509,875 B1 | 1/2003 | Nair et al. | |
| 6,518,930 B2 | 2/2003 | Itoh et al. | |
| 6,525,695 B2 | 2/2003 | McKinzie | |
| 6,538,621 B1 | 3/2003 | Sievenpiper et al. | |
| 6,768,472 B2 | 7/2004 | Alexopoulos et al. | |
| 6,917,343 B2 | 7/2005 | Sanchez et al. | |
| 6,952,565 B1 | 10/2005 | Takeda | |
| 7,042,419 B2 | 5/2006 | Werner et al. | |
| 7,245,269 B2 | 7/2007 | Sievenpiper et al. | |
| 7,388,186 B2 | 6/2008 | Berg et al. | |
| 7,429,961 B2 * | 9/2008 | Sievenpiper | H01Q 15/0013 343/700 MS |
| 7,586,384 B2 | 9/2009 | Ranta | |
| 7,619,568 B2 | 11/2009 | Gillette | |
| 7,847,633 B2 | 12/2010 | Kinget | |
| 7,852,174 B2 | 12/2010 | Cathelin | |
| 7,880,568 B2 | 2/2011 | Amin et al. | |
| 7,941,022 B1 | 5/2011 | Schaffner et al. | |
| 8,111,111 B2 | 2/2012 | Van Bezooijen | |
| 8,263,939 B2 | 9/2012 | Delaney et al. | |
| 8,358,989 B2 | 1/2013 | Kakuya et al. | |
| 8,374,561 B1 | 2/2013 | Yung | |
| 8,436,785 B1 * | 5/2013 | Lai | H01Q 15/002 343/745 |
| 8,451,189 B1 | 5/2013 | Fluhler | |
| 8,471,776 B2 | 6/2013 | Das | |
| 8,639,203 B2 | 1/2014 | Robert et al. | |
| 8,957,831 B1 | 2/2015 | Gregoire et al. | |
| 8,959,831 B2 | 2/2015 | Smith | |
| 8,976,077 B2 | 3/2015 | Colburn et al. | |
| 8,988,173 B2 | 3/2015 | Hitko et al. | |
| 9,093,753 B2 | 7/2015 | Jung et al. | |
| 2002/0041205 A1 | 4/2002 | Oppelt | |
| 2002/0167456 A1 * | 11/2002 | McKinzie, III | H01Q 3/46 343/909 |
| 2002/0167457 A1 | 11/2002 | McKinzie et al. | |
| 2003/0020655 A1 | 1/2003 | McKinzie et al. | |
| 2003/0071763 A1 * | 4/2003 | McKinzie, III | H01Q 9/0421 343/909 |
| 2004/0056814 A1 | 3/2004 | Park et al. | |
| 2004/0227667 A1 * | 11/2004 | Sievenpiper | H01Q 3/26 343/700 MS |
| 2004/0227668 A1 * | 11/2004 | Sievenpiper | H01Q 13/20 343/700 MS |
| 2004/0263420 A1 | 12/2004 | Werner et al. | |
| 2005/0146475 A1 | 7/2005 | Bettner et al. | |
| 2005/0184922 A1 | 8/2005 | Ida et al. | |
| 2007/0182639 A1 | 8/2007 | Sievenpiper et al. | |
| 2008/0088390 A1 | 4/2008 | Cathelin | |
| 2008/0094300 A1 | 4/2008 | Lee | |
| 2008/0164955 A1 | 7/2008 | Pfeiffer | |
| 2008/0169992 A1 * | 7/2008 | Ortiz | H01Q 9/0428 343/767 |
| 2008/0242237 A1 | 10/2008 | Rofougaran et al. | |
| 2008/0284674 A1 | 11/2008 | Herz et al. | |
| 2009/0025973 A1 | 1/2009 | Kazantsev et al. | |
| 2010/0039111 A1 | 2/2010 | Luekeke et al. | |
| 2010/0039343 A1 | 2/2010 | Uno et al. | |
| 2010/0149430 A1 | 6/2010 | Fulga | |
| 2010/0225395 A1 | 9/2010 | Patterson | |
| 2010/0231470 A1 | 9/2010 | Lee et al. | |
| 2010/0238085 A1 | 9/2010 | Fuh et al. | |
| 2011/0018649 A1 | 1/2011 | David et al. | |
| 2011/0090128 A1 | 4/2011 | Sulima et al. | |
| 2012/0287006 A1 | 11/2012 | Lenormand et al. | |
| 2013/0009720 A1 | 1/2013 | White et al. | |
| 2013/0009722 A1 | 1/2013 | White et al. | |
| 2013/0170020 A1 * | 7/2013 | Davis | B64G 1/50 359/350 |
| 2013/0200947 A1 | 8/2013 | Alexopoulos et al. | |
| 2015/0244079 A1 * | 8/2015 | White | H01Q 15/0013 343/913 |

FOREIGN PATENT DOCUMENTS

| | | |
|---|---|---|
| EP | 0295704 A2 | 12/1988 |
| EP | 2 290 745 A1 | 3/2011 |
| GB | 2288502 A | 10/1995 |
| JP | 2008 278159 A | 11/2008 |
| TW | 200845482 | 11/2008 |
| WO | 2006/054246 | 5/2006 |
| WO | 2009/090244 A1 | 7/2009 |

OTHER PUBLICATIONS

Hrabar, Silvio, Igor Krois and Aleksander Kiricenko, "Towards active dispersionless ENZ metamaterial for cloaking applications," Metamaterials, vol. 4, Issues 2-3, Aug.-Sep. 2010, pp. 89-97.*

U.S. Appl. No. 12/768,563, filed Apr. 27, 2010, Michael W. Yung.

U.S. Appl. No. 13/441,730, filed Apr. 6, 2012, Hitko et al.

U.S. Appl. No. 14/188,225, filed Feb. 24, 2014, Gregoire et al.

U.S. Appl. No. 14/188,264, filed Feb. 24, 2014, White et al.

U.S. Appl. No. 14/335,737, filed Jul. 18, 2014, White et al.

D. Sievenpiper, L. Zhang, R. Broas, N. Alexopolous, and E. Yablonovitch, "High-impedance electromagnetic surfaces with a forbidden frequency band," IEEE Trans. Microwave Theory Tech., vol. 47, pp. 2059-2074, Nov. 1999.

F. Costa, S. Genovesi, and A. Monorchio, "On the bandwidth of high-impedance frequency selective surfaces", IEEE AWPL, vol. 8, pp. 1341-1344, 2009.

White, C. R.; May, J. W.; Colburn, J. S.; "A variable negative-inductance integrated circuit at UHF frequencies," Microwave and Wireless Components Letters, IEEE , vol. 22, No. 1, 35-37, 2012.

O. Luukkonen et al, "Simple and accurate analytical model of planar grids and high-impedance surfaces", IEEE Trans. Antennas Propagation, vol. 56, 1624, 2008.

R. M. Foster., "A reactance theorem", Bell Systems Technical Journal, vol. 3, pp. 259-267, 1924.

Gregoire, D. J.; Colburn, J. S.; White, C. R.; "A coaxial TEM cell for direct measurement of UHF artificial magnetic conductors", IEEE Antenna and Propagation Magazine, 54, 251-290, 2012.

S. Stearns, "Non-Foster circuits and stability theory," *Proc. IEEE Ant. Prop. Int. Symp.*, 2011, pp. 1942-1945.

S. E. Sussman-Fort and R. M. Rudish, "Non-Foster impedance matching of electrically-small antennas," IEEE Trans. Antennas Propagation, vol. 57, No. 8, Aug. 2009.

C. R. White and G. M. Rebeiz, "A shallow varactor-tuned cavity-backed-slot antenna with a 1.9:1 tuning range," IEEE Trans. Antennas Propagation, 58(3), 633-639, Mar. 2010.

International Search Report and Written Opinion for PCT/US/2012/032638 mailed on Oct. 29, 2012.

International Search Report and Written Opinion for PCT/US2012/032648 mailed on Dec. 14, 2012.

International Preliminary Report on Patentability for PCT/US2012/045632 mailed on Jul. 10, 2013.

International Preliminary Report on Patentability for PCT/US2012/32638 mailed on Jun. 27, 2013.

International Search Report and Written Opinion for PCT/US2012/045632 mailed on Jan. 10, 2013.

International Preliminary Report on Patentability for PCT/US2012/032648 mailed on Oct. 17, 2013.

From U.S. Appl. No. 12/768,563 (now U.S. Pat. No. 8,374,561), Notice of Allowance mailed on Oct. 23, 2012.

From U.S. Appl. No. 12/768,563 (now U.S. Pat. No. 8,374,561), Non-Final Office Action mailed on Jun. 13, 2012.

(56) References Cited

OTHER PUBLICATIONS

Slideshow for "Matching Network Design Using Non-Foster Impedances" by Stephen E. Sussman-Fort, Ph.D. of EDO Corporation (printed from the Internet on Jun. 30, 2011) (43 pages).

Cyril Svetoslavov Mechkov, "A heuristic approach to teaching negative resistance phenomenon," *Third International Conference—Computer Science '06*, Istanbul, Turkey, Oct. 12-15, 2006 (6 pgs).

White Paper by the Virginia Tech Antenna Group of Wireless @ Virgina Tech "Non-Foster Reactance Matching for Antennas," pp. 1-5 <http://wireless.vt.edu/research/Antennas_Propagation/Whitepapers/Whitepaper-Non-Foster_Reactance_Matching_for_Antennas.pdf>.

Stephen E. Sussman-Fort, "Gyrator-Based Biquad Filters and Negative Impedance Converters for Microwaves," *International Journal of RF and Microwave Computer-Aided Engineering*, vol. 8, No. 2, pp. 86-101, 1998.

Stephen E. Sussman-Fort, "Matching Network Design Using Non-Foster Impedances," *International Journal of RF and Microwave Computer-Aided Engineering*, vol. 16, Issue 2, pp. 135-142, Feb. 2006.

S.E. Sussman and R.M. Rudish, "Non-Foster Impedance matching for transmit applications," *IEEE Xplore*, EDO Corporation and Dept. of Electrical and Computer Engineering. pp. 53-56, Mar. 6-8, 2006.

S.E. Sussman-Fort and R.M. Rudish. EDO Corporation, "Increasing efficiency or bandwidth of electrically small transmit antennas by impedance matching with non-foster circuits", Progress in Electromagnetics Research Symposium 2006, Cambridge, USA, Mar. 26-29, 2006.

Bezooijen, et al. "RF-MEMS based adaptive antenna matching module," IEEE Radio Frequency Integrated Circuits Symposium, p. 573-576, 2007.

J.G. Linvill, "Transistor negative-impedance converters", *Proceedings of the IRE*, vol. 41, pp. 725-729, Jun. 1953.

R.L. Brennan, Et al., "The CMOS negative impedance converter", *IEEE Journal of Solid-State Circuits*, 32(5), Oct. 1988.

C.R. White, J.W. May and J.S. Colburn, "A Variable negative-inductance integrated circuit at UHF frequencies", *IEEE MWCL*, 22(1), Jan. 2012.

B. H. Fong, et al., "Scalar and tensor holographic artificial impedance surfaces", *Trans. Antennas and Propag.*, vol. 58, pp. 3212-3221, Oct. 2010.

J.S. Colburn, et al., "Adaptive Artificial Impedance Surface Conformal Antennas", *Proc. IEEE Antennas and Propagation Society Int. Symp.*, 2009, pp. 1-4.

D.J. Kern, D.H. Werner and M. J. Wilhelm, "Active negative impedance loaded EBG structures for the realization of ultra-wideband artificial magnetic conductor", *Proc. IEEE Antennas and Propagation Society Int. Symp.*, 2003, pp. 427-430.

K. Song and R.G. Rojas, "Non-foster impedance matching of electrically small antennas," *Proc. IEEE Ant. Prop. Int. Symp.*, Jul. 2010.

A. S. Adonin, K. o. Petrosjanc, I. V. Poljakov, "Monolith Optoelectronic Integrated Circuit With Built-In Photovoltaic Supply for Control and Monitoring," 1998 IEEE International Conference on Electronics, Circuits and Systems, vol. 2, pp. 529-531, (1998).

D.J. Gregoire, C.R. White, and J.S. Colburn,"Non-foster metamaterials", *Antenna Applications Symposium 2011*, Sep. 2011.

EPO Supplementary European Search Report with European Search Opinion dated Oct. 8, 2014 from European Patent Application No. 12768357.1.

Chen, Ying et al., "Wideband Varactorless LC VCO Using a Tunable Negative-Inductance Cell" , IEEE Transactions on Circuits and Systems, I: Regular Papers, IEEE, US, vol. 57, No. 10, Oct. 1, 2010, pp. 2609-2617 and II. A Principle of Tunable NI Cell, p. 2609.

Ramirez-Angulo, J. et al.: "Simple technique using local CMFB to enhance slew rate and bandwidth of one-stage CMOS op-amps", Electronics Letters, IEE Stevenage, GB, vol. 38, No. 23, Nov. 7, 2002, pp. 1409-1411.

Chinese Office Action dated Oct. 27, 2014 from Chinese Patent Application No. 2012800334482 with English translation.

Staple, et al. "The End of Spectrum Scarcity," published by IEEE Spectrum, Mar. 2004, pp. 1-5.

EPO Supplementary European Search Report with European Search Opinion dated Jul. 29, 2014 from European Patent Application No. 12767559.3.

Hrabar S., et al., "Towards active dispersion less ENZ metamaterial for cloaking applications", Metamaterials, Elsevier BV, NL, vol. 4, No. 2-3, Aug. 1, 2010 (Aug. 1, 2010), pp. 89-97.

Gregoire, Daniel J., et al., "Wideband Artificial Magnetic Conductors Loaded With Non-Foster Negative Inductors", IEEE Antennas and Wireless Propagation Letters, IEEE, Piscataway, NJ, US, vol. 10, Dec. 26, 2011 (Dec. 26, 2011), pp. 1586-1589.

Kern D. J., et al., "Design of Reconfigurable Electromagnetic Bandgap Surfaces as Artificial Magnetic Conducting Ground Planes and Absorbers", Antennas and Propagation Society International Symposium 2006, IEEE Albuquerque, NM, USA Jul. 9-14, 2006, Piscataway, NJ, USA, IEEE, Piscataway, NJ, USA, Jul. 9, 2006 (Jul. 9, 2006), pp. 197-200.

Gower, John, Optical Communications Systems, 2nd edition, Prentice Hall, 1993, pp. 40-46.

From U.S. Appl. No. 13/441,730 (now U. S. Publication No. 2012-0256709 A1), Notice of Allowance mailed on Nov. 10, 2014.

From U.S. Appl. No. 13/441,730 (now U. S. Publication No. 2012-0256709 A1), Notice of Allowance mailed on Jul. 28, 2014.

From U.S. Appl. No. 13/441,730 (now U. S. Publication No. 2012-0256709 A1), Non-Final Office Action mailed on Mar. 13, 2014.

From U.S. Appl. No. 13/472,396 (now U. S. Publication No. 2013-0009722 A1), Non-Final Office Action mailed on Dec. 2, 2014.

From U.S. Appl. No. 13/472,396 (now U. S. Publication No. 2013-0009722 A1), Non-Final Office Action mailed on Jul. 30, 2014.

From U.S. Appl. No. 13/177,479 (now U. S. Publication No. 2013-0009720 A1), Non-Final Office Action mailed on Dec. 2, 2014.

From U.S. Appl. No. 13/177,479 (now U. S. Publication No. 2013-0009720 A1), Non-Final Office Action mailed on Jun. 4, 2014.

From U.S. Appl. No. 13/441,659 (now U.S. Pat. No. 8,976,077), Notice of Allowance mailed on Oct. 30, 2014.

From U.S. Appl. No. 13/441,659 (now U.S. Pat. No. 8,976,077), Final Office Action mailed on Jul. 1, 2014.

From U.S. Appl. No. 13/441,659 (now U.S. Pat. No. 8,976,077), Non-Final Office Action mailed on Feb. 24, 2014.

From U.S. Appl. No. 14/188,225 (Application and Office Actions).

From U.S. Appl. No. 14/188,264 (Application and Office Actions).

From U.S. Appl. No. 14/335,737 (Application and Office Actions).

Chinese Office Action dated Dec. 2, 2014 from Chinese Patent Application No. 201280021746 with English summary.

International Search Report and Written Opinion for PCT/US2014/072233 mailed on Mar. 16, 2015.

U.S. Appl. No. 13/910,039, filed Jun. 4, 2013, Gregoire.

From U.S. Appl. No. 13/910,039 (unpublished, non publication requested), Office Action mailed on Jun. 15, 2015.

Office Action dated Jun. 8, 2015 from Chinese Patent Application No. 201280033448.2 with machine English translation.

Pozar, David M., *Microwave Engineering*, Second Edition, John Wiley & Sons, Inc., 1998, pp. 89-90 and 629-631 with table of contents (16 pages).

Sandel, B., Radio Frequency Amplifiers, A.S.T.C., Chapter 23, pp. 912-946, 1960.

Office Action dated Jul. 22, 2015 from Chinese Patent Application No. 201280021746.X with brief English summary.

From U.S. Appl. No. 13/472,396, Office Action mailed on Sep. 11, 2015.

From U.S. Appl. No. 13/472,396 (now U. S. Publication No. 2013-0009722 A1), Final Office Action mailed on Apr. 9, 2015.

EPO Extended Search Report with Search Opinion dated Mar. 19, 2015 from European Patent Application No. 12806913.5.

(56) References Cited

OTHER PUBLICATIONS

Mirzaei, H, et al.: "A wideband metamaterial-inspired compact antenna using embedded non-Foster matching," Antennas and Propagation (APSURSI), 2011 IEEE International Symposium on, IEEE. Jul. 3, 2011 (Jul. 3, 2011), pp. 1950-1953.
From U.S. Appl. No. 13/472,396 (Now Published as US 2013-0009722 A1), Non Final Rejection dated Sep. 11, 2015.
From Chinese Patent Application No. 201280021449.5, PRC Office Action dated Sep. 29, 2015 with a brief English summary.
From Chinese Patent Application No. 201280033448.2, PRC Office Action dated Nov. 17, 2015 with Brief English summary.
From U.S. Appl. No. 14/188,225 (Now Published as 2015/0244080), Non-Final Rejection mailed on Nov. 3, 2015.
From U.S. Appl. No. 14/335,737 (Unpublished, Non-Publication Requested), Non-Final Rejection mailed on Dec. 30, 2015.
From U.S. Appl. No. 13/910,039 (unpublished, non publication requested), Final Office Action mailed on Jun. 29, 2016.
From U.S. Appl. No. 14/188,225 (now U.S. Pat. No. 9,379,448), Notice of Allowance mailed on Mar. 11, 2016.
From U.S. Appl. No. 14/335,737 (unpublished, non publication requested), Notice of Allowance mailed on Mar. 11, 2016.
Chinese Office Action dated Jan. 7, 2016 form Chinese Patent Application No. 201280021746 with English Summary.
Chinese Office Action dated Jun. 22, 2016 form Chinese Patent Application No. 201280021746 with brief English Summary.
From U.S. Appl. No. 13/910,039 (Unpublished, Non-Publication Requested), Non-Final Rejection mailed on Nov. 25, 2015.
From Chinese Application No. 201480072872.7, Office Action mailed on Feb. 4, 2017 and its brief English summary.
Dong, Anhong. "Frequency Selection Surfaces Design Based on Substrate Integrated Waveguide." Nanjing University of Science and Technology. Mar. 18, 2013. pp. 6, 7, 21, and 22. (And its English abstract.).
Yao, Bofeng. "Study of Thin Absorbing Structures Using Metamaterials." Xidian University. Dec. 2010. pp. 33-34. (And its English translation—OCR by Adobe Acrobat X Pro, Google Translate).
Kamardin et al. "Printed Dipole with Slot EBG Structures with Artificial Magnetic Conductor and Band-Notched Behaviors." IEEE International RF and Microwave Conference. Dec. 12-14, 2011. pp. 217-222.
Dutta et al. "Unidirectional AMC Reflector Backed L-band Annular Slot Antenna." IEEE International Conference on Microwaves, Communications, Antennas and Electronic Systems. Nov. 2-4, 2015. pp. 1-5.

\* cited by examiner

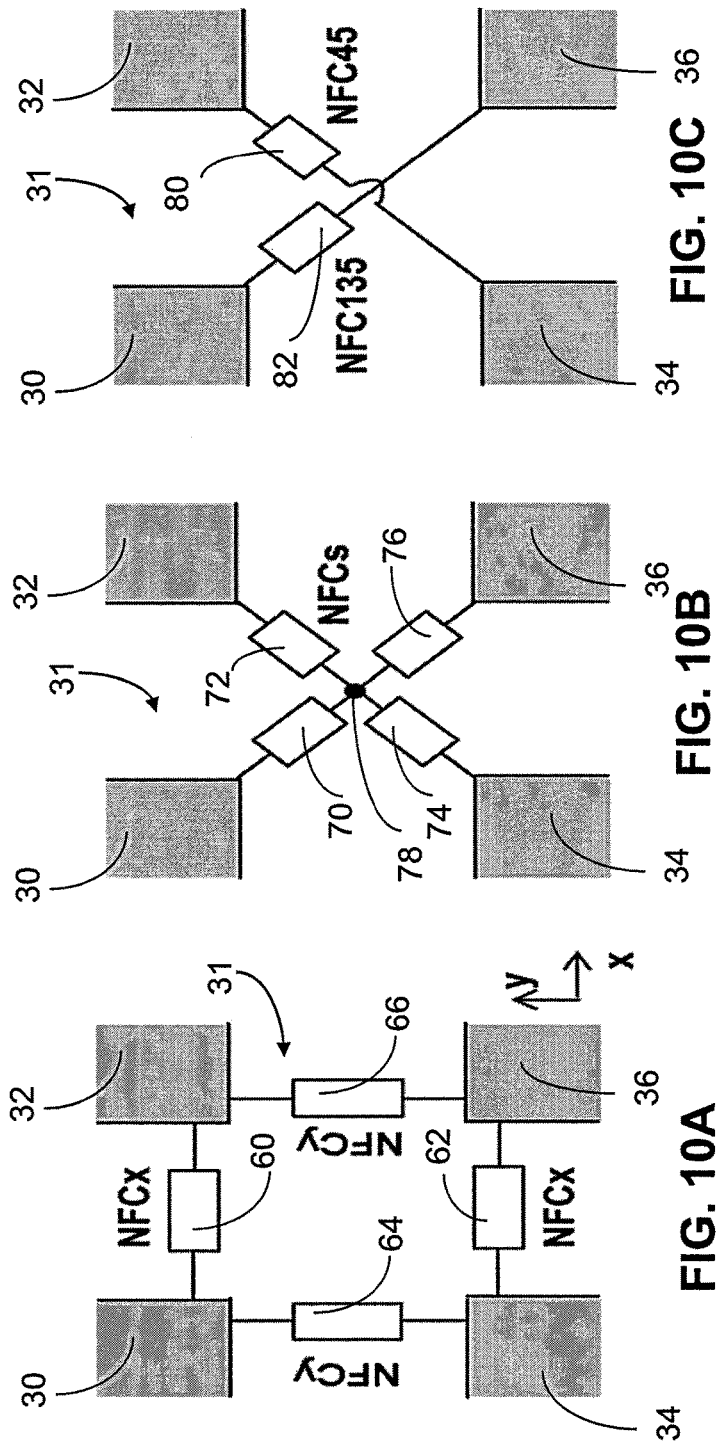

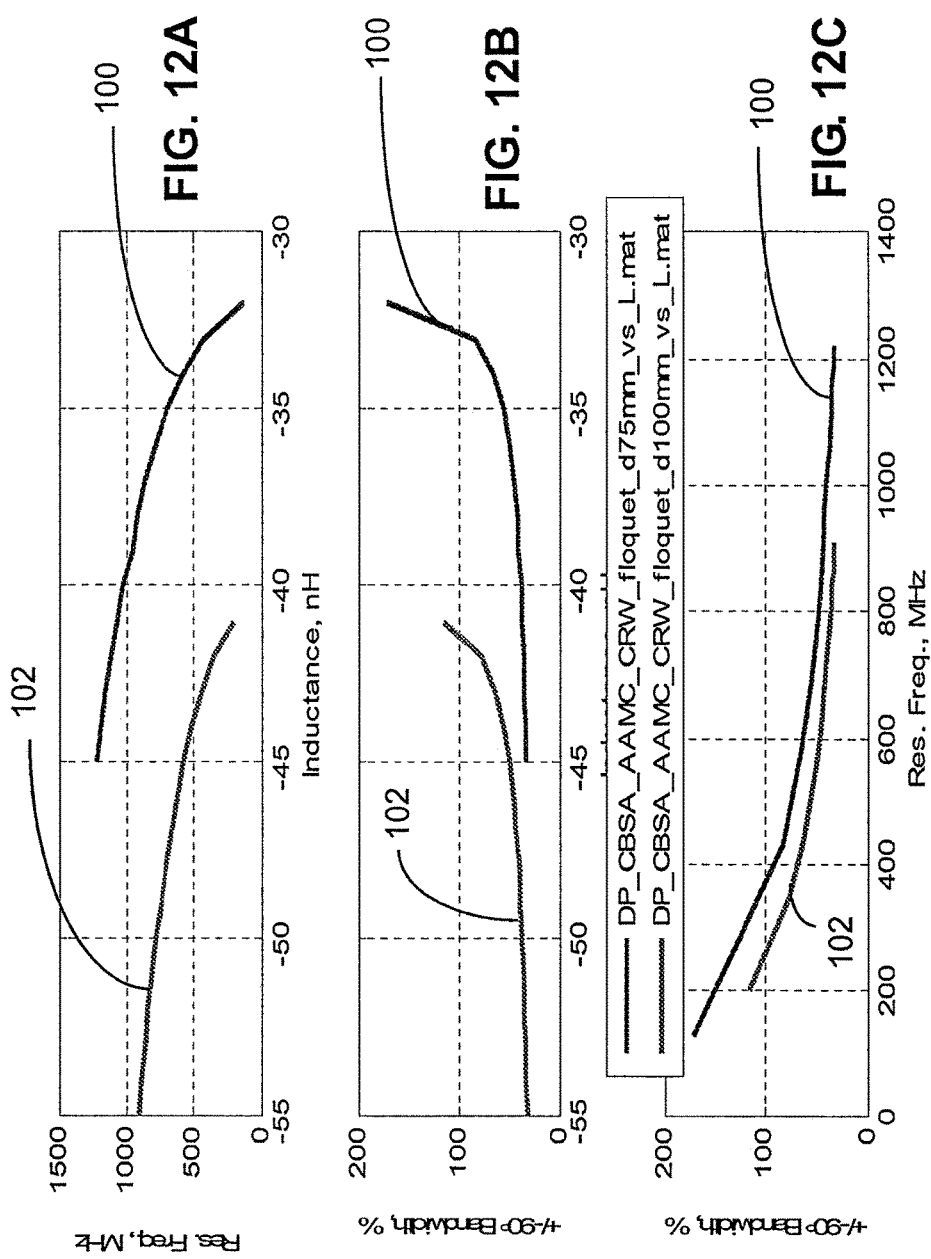

CAVITY-BACKED ARTIFICIAL MAGNETIC CONDUCTOR

CROSS REFERENCE TO RELATED APPLICATIONS

This Application is related to and claims priority from U.S. patent application Ser. No. 14/188,225, filed Feb. 24, 2014, and is a continuation-in-part (CIP) of U.S. patent application Ser. No. 14/188,264, filed on Feb. 24, 2014 which are incorporated by reference herein as though set forth in full.

TECHNICAL FIELD

This disclosure relates to active artificial magnetic conductors (AAMCs).

BACKGROUND

It is often desirable to place antennas near and parallel to metallic surfaces, such as on an aircraft wing. However these surfaces reflect electromagnetic waves out of phase with the incident wave, thus short circuiting the antennas. While naturally occurring materials reflect electromagnetic waves out of phase, artificial magnetic conductors (AMCs) are metasurfaces that reflect incident electromagnetic waves in phase. AMCs are typically composed of unit cells that are less than a half-wavelength and achieve their properties by resonance. Active circuits, for example negative inductors or non-Foster circuits (NFCs), have been employed to increase the bandwidth, thus constituting an active AMC (AAMC). However, the use of negative inductors or non-Foster circuits (NFCs), results in a conditionally stable AAMC that must be carefully designed to avoid oscillation.

AAMCs may improve antennas in a number of ways including 1) increasing antenna bandwidth, as described in references [6] and [11] below, 2) reducing finite ground plane edge effects for antennas mounted on structures to improve their radiation pattern, 3) reducing coupling between antenna elements spaced less than one wavelength apart on structures to mitigate co-site interference, 4) enabling radiation of energy polarized parallel to and directed along structural metal surfaces, and 5) increase the bandwidth and efficiency of cavity-backed slot antennas while reducing cavity size. Use of AAMC technology is particularly applicable for frequencies less than 1 GHz where the physical size of a traditional AMC becomes prohibitive for most practical applications.

An Artificial Magnetic Conductor (AMC) is a type of metamaterial that emulates a magnetic conductor over a limited bandwidth, as described in references [1] and [2] below. An AMC ground plane enables conformal antennas with currents flowing parallel to the surface because parallel image currents in the AMC ground plane enhance their sources. In the prior art, AMCs have been realized with laminated structures composed of a periodic grid of metallic patches distributed on a grounded dielectric layer, as described in references [1] and [3] below.

AMCs may have limited bandwidth. Their bandwidth is proportional to the substrate thickness and permeability, as described in references [1] to [4] below. At VHF-UHF frequencies, the thickness and/or permeability necessary for a reasonable AMC bandwidth is excessively large for antenna ground-plane applications.

The bandwidth limitation of an AMC may be overcome by using an active AMC (AAMC). An AAMC is loaded with non-Foster circuit (NFC) negative inductors, as described in references [1] to [6] below, and an AAMC may have an increased bandwidth of 10× or more compared to an AMC, as described in references [1], [4] and [5] below. When the AMC is loaded with an NFC, its negative inductance in parallel with the substrate inductance results in a much larger net inductance and hence, a much larger AMC bandwidth.

A prior-art AAMC unit cell architecture is shown in FIG. 1. The AAMC has a ground plane 112, a 2.54 cm thick foam substrate 114, a 0.76 mm thick dielectric substrate 116, copper patches 118, which are about 65 mm wide and long, a 10 mm gap 120 between patches 118, a non-Foster circuits (NFC) 122 between patches 118, a wiring access hole 124, and a via to ground 126. The patches 118 are about 50 mm thick.

An Artificial Magnetic Conductor (AMC) is characterized by its resonant frequency, $\omega_0$, which is where an incident wave is reflected with 0° phase shift, and by its ±90° bandwidth, which is defined as the frequency range where the reflected phase is within the range $|\phi_r|<90°$. An AMC response can be accurately modeled over a limited frequency range using an equivalent parallel LRC circuit with $L_{AMC}$, $C_{AMC}$, and $R_{AMC}$ as the circuits' inductance, capacitance and resistance respectively, as described in references [1] to [3] and [7] below. The circuit impedance is $$Z_{AMC} = \frac{j\omega L_{AMC}}{1 - \omega^2 L_{AMC} C_{AMC} + j\omega L_{AMC}/R_{AMC}}. \quad (1)$$

The resonant frequency and approximate fractional bandwidth [2] in the limit $\omega_0 L_{AMC} \ll Z_0$ are $$\omega_0 = \frac{1}{\sqrt{L_{AMC} C_{AMC}}}, \quad (2)$$

$$BW = \omega_0 L_{AMC}/Z_0,$$

where $Z_0$ is the incident wave impedance.

An AMC of the form shown in FIG. 1, where a grounded dielectric substrate is covered with a grid of metallic patches loaded with lumped elements between the patches can be approximated by a simple transmission line model, as described in references [1] and [3] below, which expresses the AMC admittance as the sum of the grid admittance $Y_g$, the load admittance $Y_{load}$, and the substrate admittance $Y_{sub}$ $$Y_{AMC}=Y_g+Y_{load}+Y_{sub}. \quad (3)$$

$$Y_{sub}=-j \cot(\sqrt{\in\mu}\,\omega d)\sqrt{\in/\mu}, \quad (4)$$

where d is the dielectric thickness, and $\in$ and $\mu$ are the substrate's permittivity and permeability respectively. $Y_{sub}$ is expressed in terms of a frequency-dependent inductance, $L_{sub}=-j/(\omega Y_{sub})$ which is approximately a constant $L_{sub} \approx \mu d$ for thin substrates with $\sqrt{\in\mu}\,\omega d \ll 1$. The grid impedance of the metallic squares is capacitive, $Y_g=j\omega\,C_g$, and can be accurately estimated analytically, as described in references [2] and [7] below.

The loaded AMC reflection properties can be estimated by equating the LRC circuit parameters of equation (1) to quantities in the transmission line model of equations (3) and (4). If the load is capacitive, then the equivalent LRC circuit parameters are $$L_{AMC}=L_{sub},\ C_{AMC}=C_g+C_{load} \text{ and } R_{AMC}=R_{load}. \quad (5)$$

If the load is inductive as it is in the AAMC of FIG. 1, then they are $$L_{AMC} = \frac{L_{Load} L_{sub}}{L_{Load} + L_{sub}}, \quad (6)$$

$$C_{AMC} = C_g \text{ and } R_{AMC} = R_{load}.$$

An active AMC is created when the load inductance is negative, and $L_{AMC}$ increases according to equation (6). When $L_{load} < 0$ and $|L_{load}| > L_{sub} > 0$, then $L_{AMC} > L_{sub}$, resulting in an increase in the AMC bandwidth, and a decrease in the resonant frequency according to equation (2). When $L_{load}$ approaches $-L_{sub}$, then $L_{AMC}$ is maximized, the resonant frequency is minimized and the bandwidth is maximized. The bandwidth and resonant frequency are prevented from going to infinity and 0 respectively by loss and capacitance in the NFC and the AMC structure.

The AAMC is loaded with non-Foster circuit (NFC) negative inductors, as described in references [1] and [6] below. The NFC is the critical element that enables realization of the AAMC and its high bandwidth. The NFC name alludes to the fact that it circumvents Foster's reactance theorem, as described in reference [8] below, with an active circuit. Details of an NFC circuit design and fabrication are given by White in reference [6] below.

FIG. 2A shows an NFC circuit 130 on a carrier board, which also has capacitors 132, RF (radio frequency) pads 134, and DC (direct current) pads 136. The NFC can be represented by the equivalent circuit model shown in FIG. 2B. In this model, $L_{NFC}$ is the desired negative inductance, $R_{NFC}$ is negative resistance. $C_{NFC}$ and $G_{NFC}$ are positive capacitance and conductance, respectively. In an ideal NFC, $R_{NFC}$, $C_{NFC}$ and $G_{NFC}$ are all equal to zero. The equivalent circuit parameters vary according to the bias voltage applied and some prior-art NFC circuit parameters are plotted in FIG. 3.

NFCs become unstable when the bias voltage goes too high, when they are subjected to excessive RF power, or when they have detrimental coupling with neighboring NFCs. The instability is manifested as circuit oscillation and emission of radiation from the circuit. When the NFCs in an AAMC become unstable, the AAMC no longer operates as an AMC. One consequence of this in the prior art, as described in reference [1] below, is that it has not been possible to create a dual-polarization AAMC because of instability caused by coupling between neighboring NFCs.

Single-polarization AAMCs have been demonstrated in the prior art, as described in references [1] and [9] below. Coupling between neighboring NFCs in the E plane, meaning between NFCs in neighboring rows, as shown in FIGS. 4A and 4B, causes the single-polarization AAMC to be unstable. As shown in FIG. 4A, patch elements 140 with impedance loads 142 are each on a substrate 146 with a ground plane 148. In order to make the AAMC stable, RF isolation plates 144 must be installed between rows of patch elements 140 in the H plane. The isolation plates 144 span through the substrate 146 from the ground plane 148 to the patch elements 140. The AAMC operates for RF incident polarized perpendicular to the isolation plates 144. Incident radiation polarized along the other axis will be reflected as from a metal conductor because of its interaction with the isolation plates. NFCs next to each other in the H plane do not couple in an unstable manner.

Coaxial versions of the single-polarization AAMC, as shown in FIG. 5A, have been constructed and measured. The coaxial version is convenient for measurement because it can be measured in a bench top setting using a coax transverse-electromagnetic (TEM) cell, as shown in FIG. 5B, that provides direct real-time measurements of AMC phase and amplitude vs. frequency, as described in reference [9] below. In the coax TEM cell, the coax AAMC appears to the incident wave in the coax as an infinite array of unit cells because of its azimuthal periodicity and the PEC boundaries on the radial walls. The fields are polarized radially, and neighboring NFCs do not couple unstably because their separation is perpendicular to the field polarization.

FIG. 5C shows measurements of the coax AAMC that confirm its operation as a stable wideband AMC. The NFC inductance is tuned from −70 to −49.5 nH. The phase and magnitude of a reflected wave vs. frequency is shown. In this AAMC, the resonant frequency can be tuned from approximately 470 MHz to 220 MHz while maintaining stability. When tuned to 263 MHz, as represented by the bold line in FIG. 5C, the ±90° bandwidth is more than 80%, spanning the range from 160 to 391 MHz. The prior-art AAMC has much higher bandwidth than an equivalent passive AMC, as shown in FIG. 6. The AAMC has better than five times the bandwidth of a varactor-loaded AMC at high loading levels.

REFERENCES

[1] Gregoire, D.; White, C.; Colburn, J.; "Wideband artificial magnetic conductors loaded with non-Foster negative inductors," Antennas and Wireless Propagation Letters, IEEE, vol. 10, 1586-1589, 2011

[2] D. Sievenpiper, L. Zhang, R. Broas, N. Alexopolous, and E. Yablonovitch, "High-impedance electromagnetic surfaces with a forbidden frequency band," IEEE Trans. Microwave Theory Tech., vol. 47, pp. 2059-2074, November 1999

[3] F. Costa, S. Genovesi, and A. Monorchio, "On the bandwidth of high-impedance frequency selective surfaces", IEEE AWPL, vol. 8, pp. 1341-1344, 2009

[4] D. J. Kern, D. H. Werner and M. H. Wilhelm, "Active negative impedance loaded EBG structures for the realization of ultra-wideband Artificial Magnetic Conductors," *Proc. IEEE Ant. Prop. Int. Symp.*, vol. 2, 2003, pp. 427-430.

[5] U.S. patent application Ser. No. 13/441,659, filed Apr. 6, 2012.

[6] White, C. R.; May, J. W.; Colburn, J. S.; "A variable negative-inductance integrated circuit at UHF frequencies," Microwave and Wireless Components Letters, IEEE, vol. 21, no. 12, 35-37, 2011

[7] O. Luukkonen et al, "Simple and accurate analytical model of planar grids and high-impedance surfaces", IEEE Trans. Antennas Propagation, vol. 56, 1624, 2008

[8] R. M. Foster., "A reactance theorem", Bell Systems Technical Journal, vol. 3, pp. 259-267, 1924.

[9] Gregoire, D. J.; Colburn, J. S.; White, C. R.; "A coaxial TEM cell for direct measurement of UHF artificial magnetic conductors", IEEE Antenna and Propagation Magazine, 54, 251-250, 2012

[10] S. Stearns, "Non-Foster circuits and stability theory," *Proc. IEEE Ant. Prop. Int. Symp.*, 2011, pp. 1942-1945.

[11] S. E. Sussman-Fort and R. M. Rudish, "Non-Foster impedance matching of electrically-small antennas," IEEE Trans. Antennas Propagation, vol. 57, no. 8, August 2009.

[12] C. R. White and G. M. Rebeiz, "A shallow varactor-tuned cavity-backed-slot antenna with a 1.9:1 tuning range," IEEE Trans. Antennas Propagation, 58(3), 633-

639, 3/2010. Reference [12] describes a varactor-tuned single polarized antenna, not a metasurface, and does not consider mutual coupling, active loading, or stability.

What is needed is a polarization independent active artificial magnetic conductor (AAMC). The embodiments of the present disclosure answer these and other needs.

SUMMARY

In a first embodiment disclosed herein, an active artificial magnetic conductor (AAMC) comprises an array of unit cells, each unit cell comprising a top face, at least one wall coupled to the top face, a base coupled to the at least one wall, and a crossed slot in the top face, wherein the top face, the at least one wall, and the base form a cavity, and wherein the top face, the at least one wall, and the base are conductive.

In another embodiment disclosed herein, an active artificial magnetic conductor (AAMC) comprises an array of unit cells, each unit cell comprising a square top face having first, second, third and fourth edges, a first wall coupled to the first edge of the top face, a second wall coupled to the second edge of the top face, a third wall coupled to the third edge of the top face, a fourth wall coupled to the fourth edge of the top face, a base coupled to the first, second, third and fourth walls, and a crossed slot in the top face, the crossed slot extending to each of the four edges of the top face, wherein the top face, the first, second, third and fourth walls, and the base form a cavity, and wherein the top face, the first, second, third and fourth walls, and the base are conductive.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 10A, 10B and 10C show loading configurations for an NFC: FIG. 10A for a square configuration with 4 NFCs, FIG. 10B for a cross (X) configuration with 4 NFCs, and FIG. 10C for a crossover configuration with 2 NFCs in accordance with the present disclosure;

FIGS. 12A, 12B and 12C show a summary of performance of a dual-polarized cavity backed slot (CBS) AAMC for d equal to 75 mm and 100 mm in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

A dual-polarized active artificial magnetic conductor (AAMC) is disclosed, which has a periodic array of unit cells that reflect electromagnetic waves polarized parallel to a surface with zero-degree phase. Each unit cell has a cavity with conducting walls with a top surface which may be planar or curved surface, and a crossed slot patterned in the top surface forming an aperture. AMC operation is achieved when the unit cell is near its parallel resonance. The resonance frequency is reduced and the bandwidth increased by connecting negative-inductance circuits, which is a class of non-Foster circuits (NFCs) across the slot, preferably near the center of the unit cell. The cavity and crossed slot may possess two orthogonal planes of symmetry that are further orthogonal to the top surface. The responses in the two principle planes may be tuned to the same frequency or different frequencies.

Figure 1:
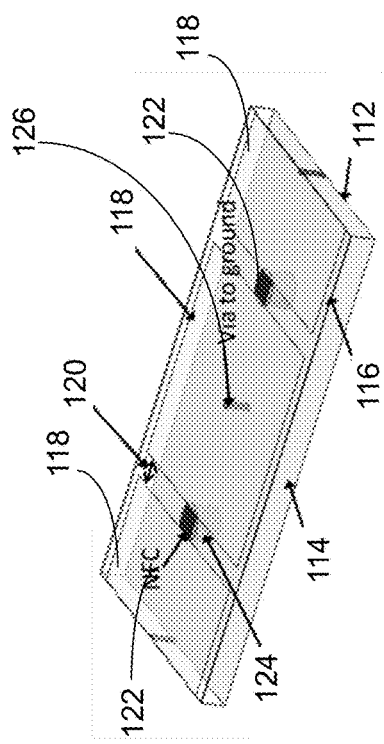
FIG. 1 shows an active artificial magnetic conductor (AAMC) in accordance with the prior art.
Figure 2B:
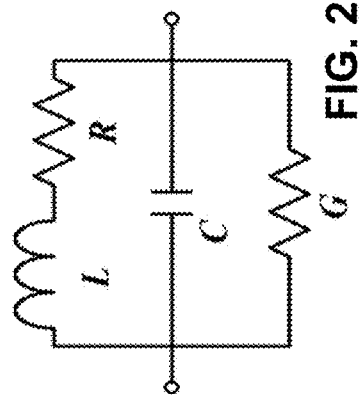
FIG. 2B shows an equivalent circuit for a non-Foster circuit (NFC) in accordance with the prior art.
Figure 2A:
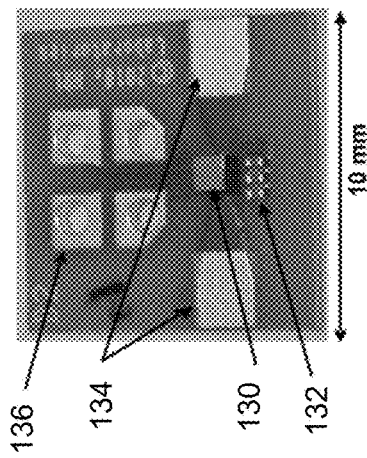
FIG. 2A shows a non-Foster circuit (NFC) on a carrier board in accordance with the prior art.
Figure 3:
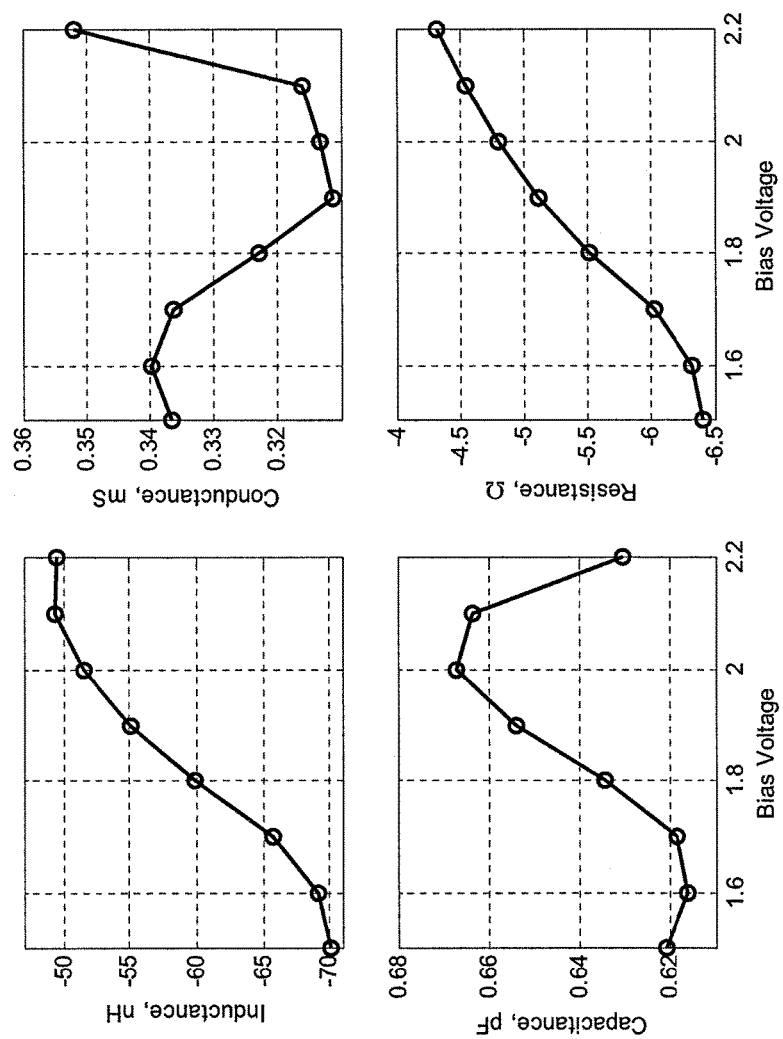
FIG. 3 shows circuit parameters of a prior art non-Foster circuit in accordance with the prior art.
Figures 4A, 4B:
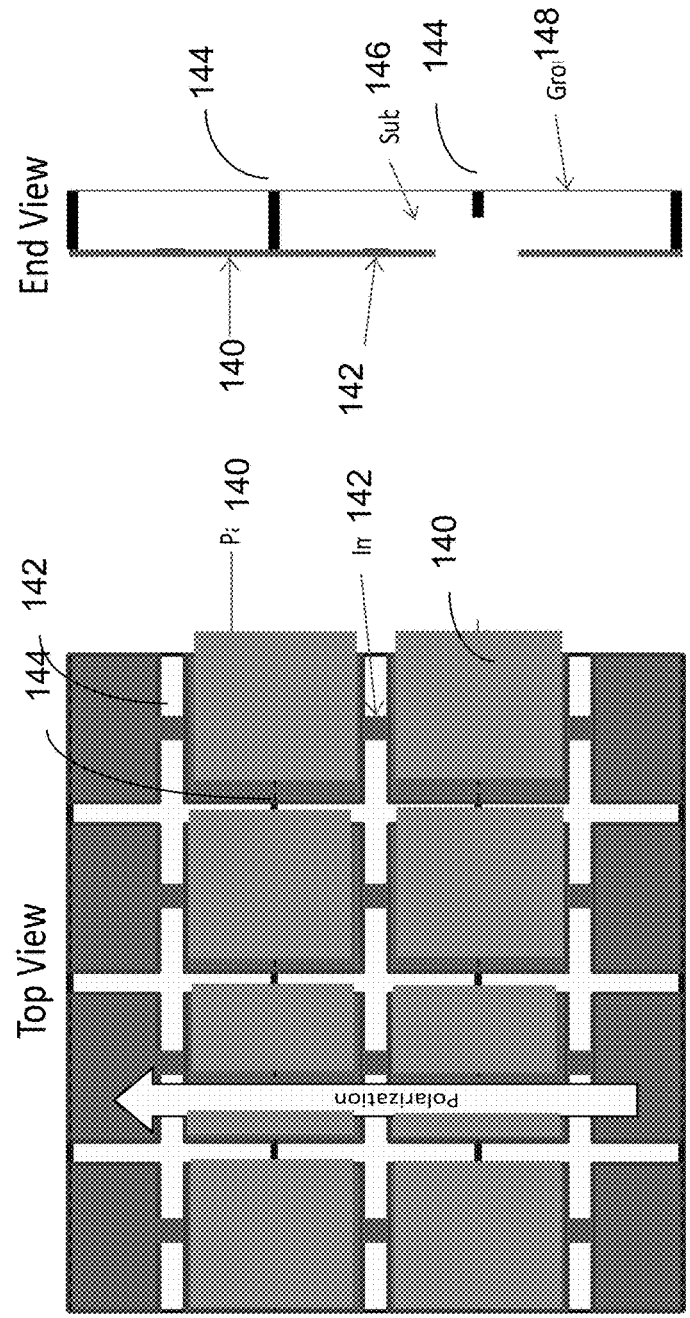
FIGS. 4A and 4B show a single-polarization AAMC in accordance with the prior art.
Figure 5C:
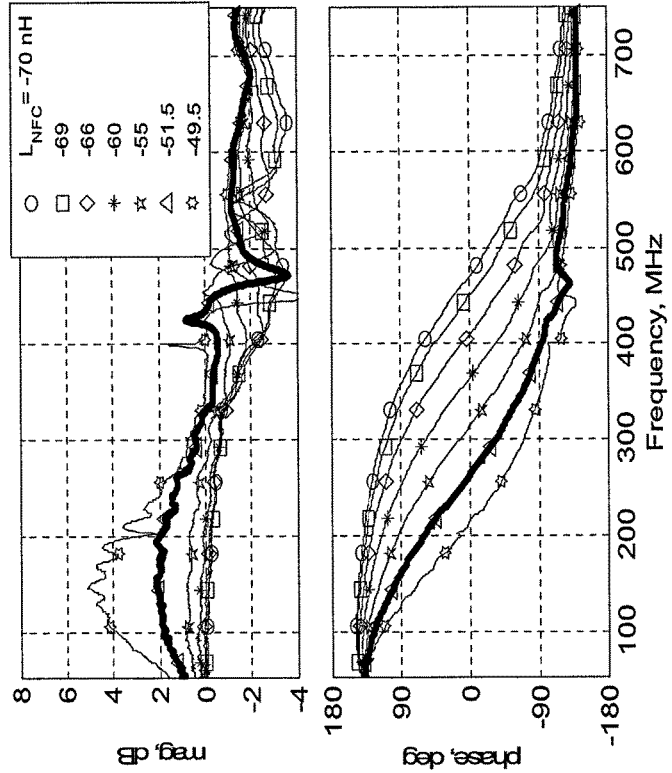
FIG. 5C shows the reflection properties of a coaxial AAMC in accordance with the prior art.
Figure 5A:
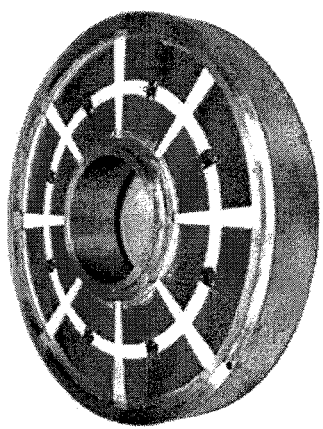
FIG. 5A shows a single-polarization coaxial AAMC.
Figure 5B:
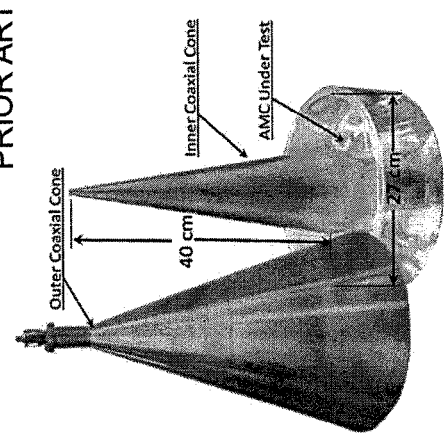
FIG. 5B shows a coaxial TEM cell used for measuring the coaxial AAMC of FIG. 5A.
Figure 6:
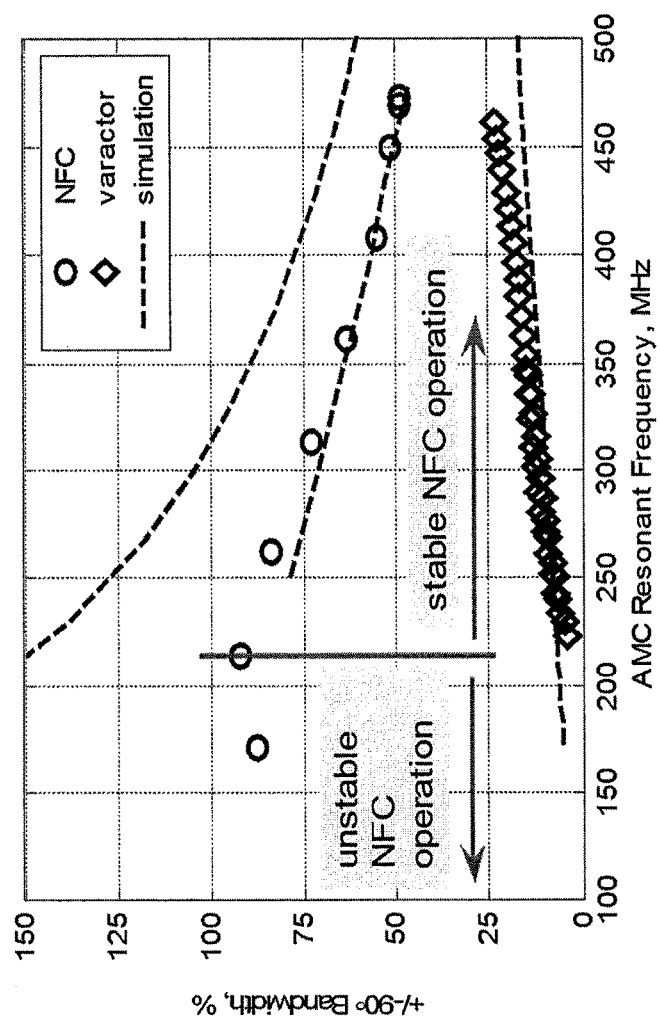
FIG. 6 shows ±90° bandwidth for an AAMC and for a varactor-loaded passive AMC in accordance with the prior art.
Figures 7A, 7B:
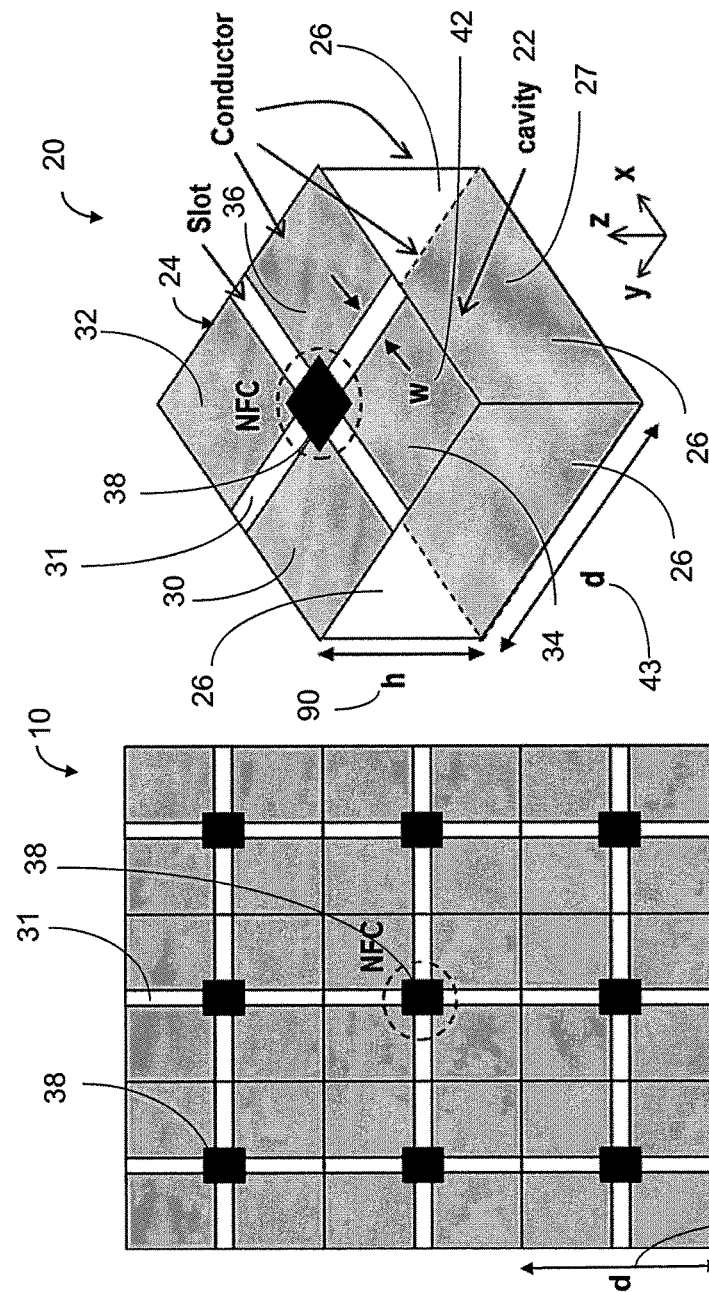
FIG. 7A shows an active artificial magnetic conductor (AAMC) and FIG. 7B shows a unit cell of an AAMC in accordance with the present disclosure.

An AAMC 10 according to the present disclosure has unit cells 20 arranged in a periodic grid or array with a period d 43, as shown in FIGS. 7A and 7B. The grid may be rectangular, square, or hexagonal, among other possible shapes. The following discussion assumes a square grid in the x-y plane with unit cells 20 symmetric about the x-z and y-z axes, as shown in FIG. 7A; however, as stated above the AAMC may have other shapes.

The unit cell 20, as shown in FIG. 7B, has a cavity 22 filled with air, dielectric, and/or magnetic material. The unit cell 20 is preferably symmetric about the x-z and y-z axes, and has a top face 24 that is planar. The cavity 22 is preferably of square cross section with size slightly less than the period d 43, but may be other cross sections and smaller than the period. The walls 26 of the cavity 22 are conductive and a crossed slot 31 is patterned in the top face 24 forming an aperture such that it is symmetric about the x-z and y-z planes, as shown in FIG. 7B. The crossed slot 31 preferably extends to the cavity walls 26. The top face 24 is divided by the crossed slot 31 into four patches 30, 32, 34 and 36. Each of the four patches 30, 32, 34 and 36 of the top face 24 is conductive. The walls 26 of the cavity and the base 27 of the cavity are also conductive.

Figures 8A, 8B:
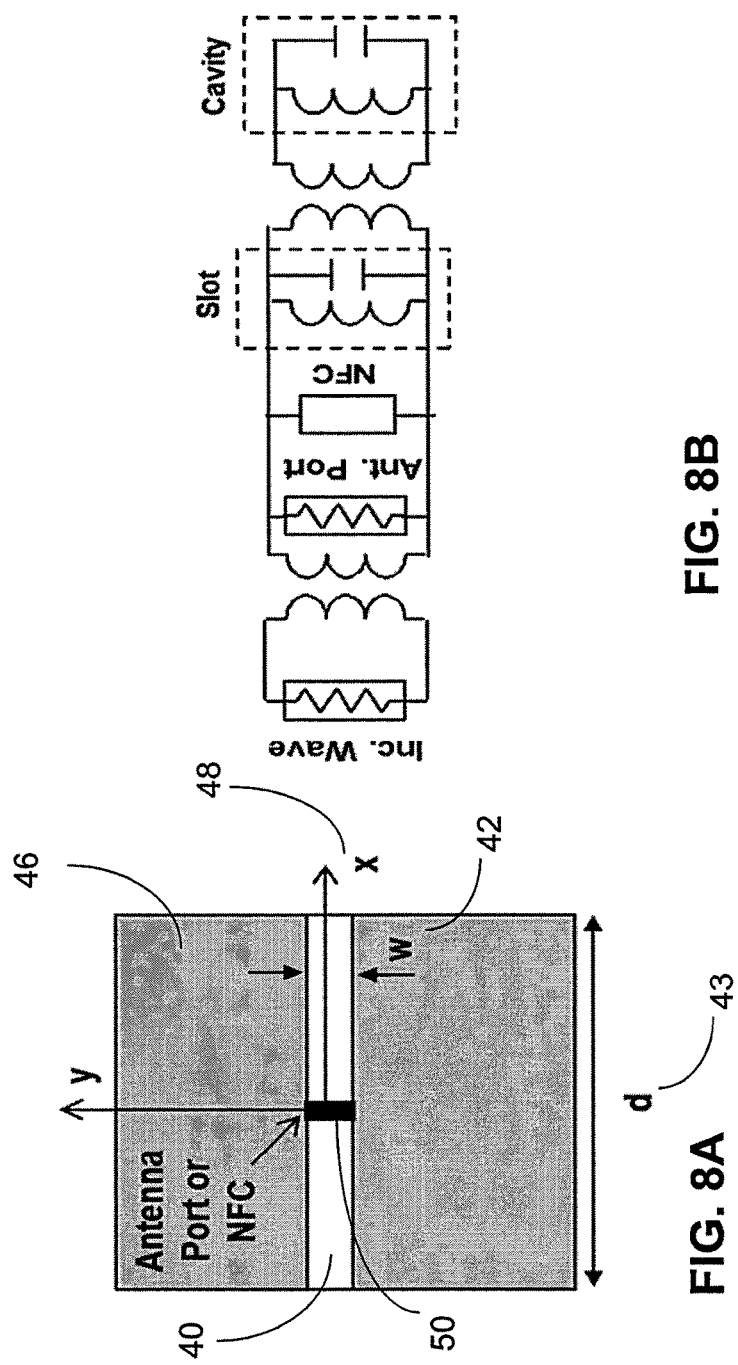
FIG. 8A shows a single polarized version of a unit cell in accordance with the present disclosure.
FIG. 8B shows an equivalent circuit for linking an NFC or antenna port to an incident wave in accordance with the prior art.

Referring now to FIG. 8A, a single polarized embodiment is shown. A rectangular slot 40 with a width w 42 much less than length d 43 is cut into the top face 46 along an x-axis 48. AAMC behavior occurs when the surface impedance of an incident wave goes through a parallel resonance. Cavity-backed slot antennas (CBSAs) are parallel resonant antennas in their first resonance, as described in reference [12]. An AAMC structure may be considered to be an infinite array of CBSAs where each element can be modeled by Floquet analysis, where an antenna port 50 has antenna terminals across the center of the slot 40 and another port is the y-polarized radiation mode at a specified angle, for example at normal incidence. The coupling between the antenna port and radiation port may be approximated by a transformer and a purely reactive parallel resonant circuit, as shown in FIG. 8B. If the antenna port is open-circuited, the radiation port sees the reactive resonant circuit, giving an AMC response. If a second Floquet port is added that is x-polarized, this second Floquet port is orthogonal to the slot radiation and thus is isolated from the antenna port. Since the second Floquet port sees mostly the conductive face, one may expect the reflection to be at 180 degrees.

Since the single polarized case has a parallel resonance, it may be tuned to lower frequencies with either a capacitance or a negative inductance, preferably located at or near the center of the top face 24. The bandwidth of parallel resonant circuits is proportional to the ratio of inductance L to capacitance C, and thus bandwidth is increased by increasing L and or reducing C, both of which can only be accomplished for a given geometry by NFCs producing negative inductance and/or negative capacitance.

Figure 9B:
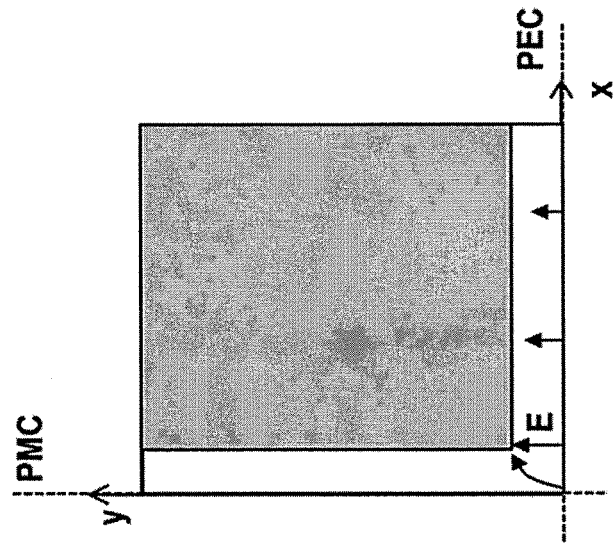
FIG. 9A shows a whole unit cell and 9B shows a differential/common mode quarter circuit when an incident field is y-polarized in accordance with the present disclosure.
Figure 9A:
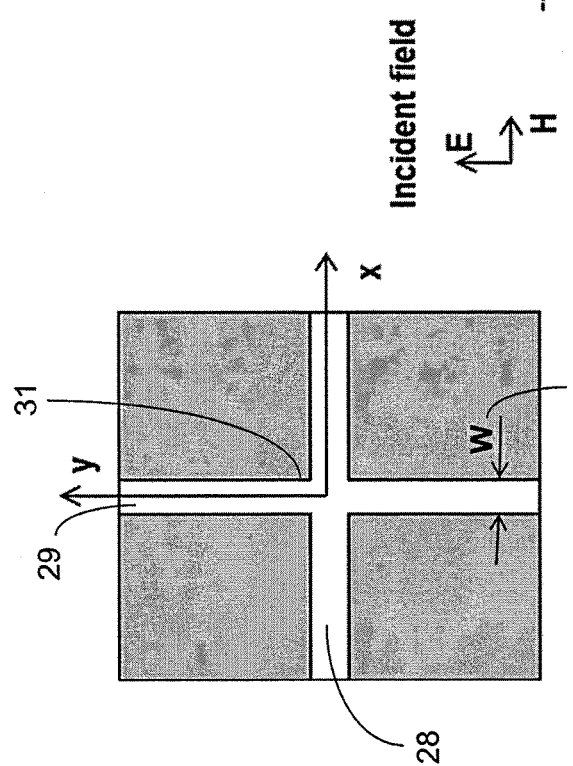

As discussed above, the y-polarized feed is isolated from x-polarized waves, thus the crossed slot 31, shown in FIGS. 7A and 7B, enables dual polarized performance. FIG. 9A shows the crossed slot 31 is composed of an x-axis slot 28 and a y-axis slot 29. FIG. 9B shows a differential/common mode quarter circuit of the entire circuit when the incident field is y-polarized. The electric field is permitted across the slot along the x axis, but not the y-axis, except at much higher frequencies. These circuits can be made with the polarization along the x and y axes (0 and 90 deg. respectively) as well as 45 and 135 degrees.

If the incident wave is y-polarized, the y-z axis is a perfect magnetic conducting (PMC) symmetry plane, which implies an electric (E) field parallel and a magnetic (H) field normal. The x-z axis is a perfect electric conducting (PEC) symmetry plane, which implies an E-field normal and an H-field parallel. Thus the problem may be broken into differential quarter circuits, as shown in FIGS. 9A and 9B, where it is apparent that the fundamental mode only exists on the x-axis slot 28. Modes along the y-axis slot 29 require the slot width w 42 to be roughly a half wavelength of the resonant frequency.

FIGS. 10A-10C show three configurations for the NFC 38 shown in FIG. 7A that may be used for tuning the AAMC 10.

The square configuration of FIG. 10A has four NFCs 60, 62, 64 and 66. The NFC 60 is in the x axis across patches 30 and 32 of the top face 24, the NFC 62 is in the x axis across patches 34 and 36 of the top face 24, the NFC 64 is in the y axis across patches 30 and 34 of the top face 24, and the NFC 66 is in the y axis across patches 32 and 36 of the top face 24. Preferably the NFCs are at or near the vicinity of the junction of the cross slots 28 and 29. While the NFCs 60 and 62 in the x-polarized patches (NFCx) should be identical, and likewise for the y-polarized patches (NFCy), if polarization independent behavior is desired, NFCx and NFCy may be different to achieve different frequencies or other characteristics. Likewise, all four NFCs 60, 62, 64 and 66 may be different if polarization rotation is desired. Differential quarter-circuit analysis shows that, if symmetry is preserved, NFCx does not affect y-polarized waves and vice versa.

The X configuration, as shown in FIG. 10B has four identical NFCs 70, 72, 74 and 76, each connected to a respective one of the four corners of patch 30, 32, 34 or 36 near the junction of the cross slots 31. The NFCs 70, 72, 74 and 76 are each connected to a common node 78 in the center of the junction. Differential-quarter-circuit analysis shows that this configuration tunes both the x- and y-polarized waves. Furthermore, if the NFCs are not identical then symmetry is broken and polarization coupling will occur.

In a crossover configuration as shown in FIG. 10C, two NFCs—NFC45 80 and NFC135 82 connect diagonal corners of the junction of the crossed slot 31, where NFC45 80 is on a 45 degree angle, and NFC135 82 is on a 135 degree angle. NFC45 80 is connected between corners of patches 32 and 34, and NFC135 82 is connected between corners of patches 30 and 36. In this configuration, the principle axes are rotated 45 degrees. The response to 45 degree polarized waves is dependent on NFC45 80, and the response to 135 degree waves is dependent on NFC135 82. The response is polarization independent if NFC45 80 is the same as NFC135 82.

The AAMC performance of the crossover configuration shown in FIG. 10C has been simulated with h 90 equal to 25.4 mm, d 43 equal to 75 and 100 mm, and negative inductance loading NFC45 equal to NFC135. AAMC operation is achieved when the reflection phase is between +/−90 degrees. The reflection phase is plotted in FIG. 11A for d 43 equal to 75 mm, and in FIG. 11B for d 43 equal to 100 mm.

FIGS. 12A, 12B and 12C summarize the performance of a dual-polarized cavity backed slot AAMC. In FIG. 12 the curves 100 are for d 43 equal to 75 mm and the curves 102 are for d 43 equal to 100 mm. FIG. 12A plots the resonant frequency versus negative inductance, FIG. 12B plots the +90 to −90 percent bandwidth versus negative inductance, and FIG. 12B plots the +90 to −90 percent bandwidth versus resonant frequency.

The unit cell with d 43 equal to 75 mm tunes from about 1200 MHz when loaded by NFCs of −45 nH to about 200 MHz when loaded by NFCs of −32 nH. When d 43 equals 100 mm, the AAMC tunes from about 900 MHz when loaded by NFCs of −55 nH to about 250 MHz when loaded by NFCs of −41 nH.

Figures 11A, 11B:
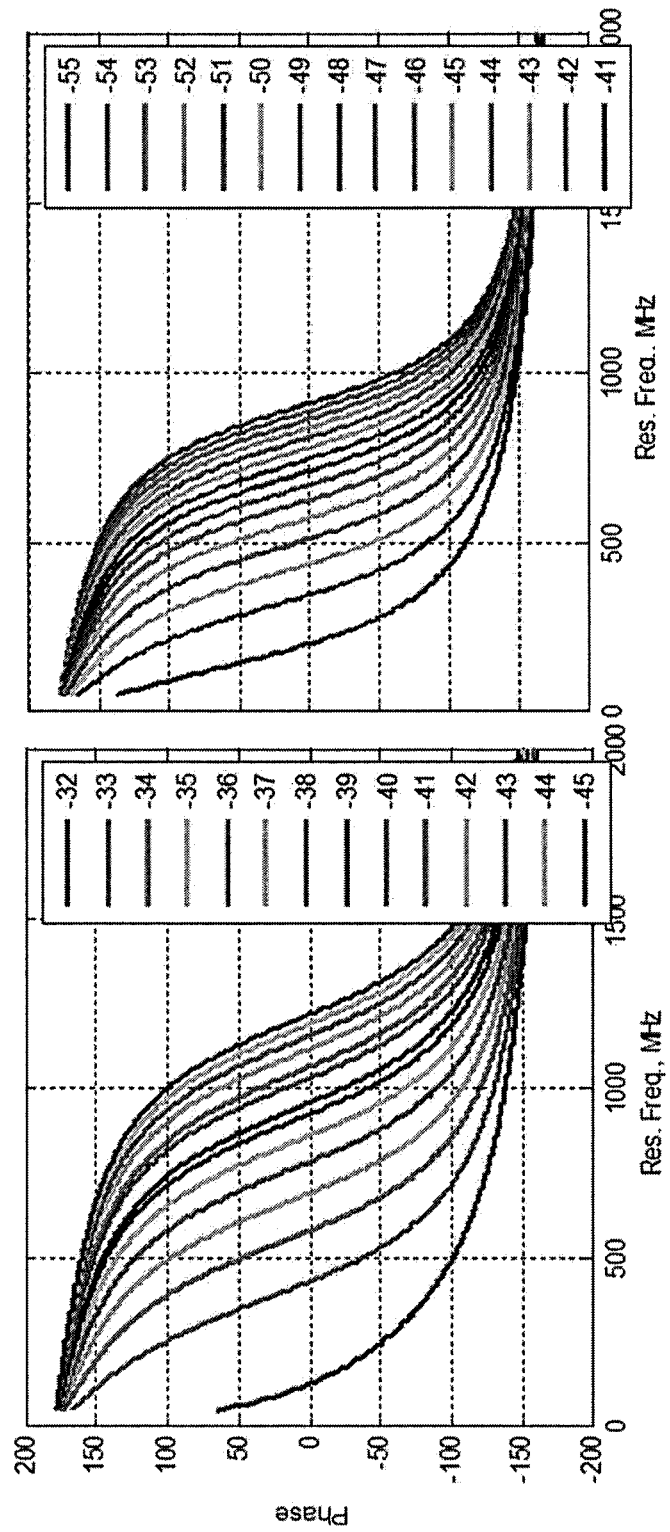
FIGS. 11A and 11B show a reflection phase of an AAMC unit cell for d equal to 75 mm and 100 mm, respectively, in accordance with the present disclosure.

As shown in FIGS. 11A and 11B, both unit cell designs with d 43 equal to 75 mm and d 43 equal to 100 mm cover the same frequency range, albeit with different negative inductance loading; however, the 75 mm unit cell has a larger bandwidth.

Stability is achieved by minimizing the mutual coupling between unit cells. This is achieved by means of the cavity walls 26 which isolate the unit cells from each other. The stability of finite AAMCs may be approximated using eigen analysis. At frequencies well below resonance, the admittance matrix may be approximated by self and mutual inductances:

$$Y \approx \frac{1}{s}\begin{pmatrix} 1/L_{11} & \cdots & 1/L_{1N} \\ \vdots & \ddots & \vdots \\ 1/L_{N1} & \cdots & 1/L_{NN} \end{pmatrix} \quad (7)$$

Where N is the number of NFCs and where $s=j2\pi f$ is the complex radian frequency of the Laplace transform. Thus the admittance matrix can be simplified to 1/s times an inductance matrix where the eigenvalues of the inductance matrix quantify an equivalent inductance for a given eigenmode. Assuming all NFCs are identical with inductance $L_{NFC}$ less than 0, the total inductance is the parallel combination of the eigenvalue $L_{eq}$ and $L_{NFC}$; the network is stable if $L_{NFC}$ is less than $-L_{eq}$ for all eigenvalues. This method may be extended to all frequencies by performing Nyquist analysis on the frequency domain admittance matrix and NFC admittance model. Preliminary analysis of a 5×5 array with d 43 equal to 75 mm, NFC45 80 varying from −45 to −32 nH and NFC135 82 omitted predicts that the AAMC 10 is stable for $L_{NFC}$ less than −37 nH, which implies that tuning from 1200 MHz to 500 MHz is achievable.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. An active artificial magnetic conductor (AAMC) comprising:
   an array of unit cells, each unit cell comprising:
      a top face;
      at least one wall coupled to the top face;
      a base coupled to the at least one wall; and
      a crossed slot in the top face, wherein the crossed slot extends to the at least one wall dividing the top face into four patches;
   wherein the at least one wall is a continuous wall between the top face and the base;
   wherein the top face, the at least one wall, and the base form a cavity inside the top face, the at least one wall, and the base; and
   wherein the four patches, the at least one wall, and the base are conductive.

2. The AAMC of claim 1 wherein:
   the top face has first, second, third and fourth edges; and
   the at least one wall comprises:
      a first wall coupled to the first edge of the top face;
      a second wall coupled to the second edge of the top face;
      a third wall coupled to the third edge of the top face; and
      a fourth wall coupled to the fourth edge of the top face.

3. The AAMC of claim 2 wherein the crossed slot extends to each of the first, second, third and fourth edges of the top face.

4. The AAMC of claim 1 further comprising:
   a material filling the cavity, the material comprising air, a dielectric material, or a magnetic material.

5. The AAMC of claim 1 wherein:
   each unit cell is symmetric about an x-z and about a y-z axis; and
   the top face is planar.

6. The AAMC of claim 2 wherein:
   the cavity has a square cross section of size slightly less than a period of repetition of the unit cells in the array of unit cells.

7. The AAMC of claim 1 further comprising:
   at least one reactive tuning element coupled across the crossed slot.

8. The AAMC of claim 7 wherein the at least one reactive tuning element comprises a Non-Foster circuit.

9. The AAMC of claim 8 wherein the Non-Foster circuit comprises a negative inductance or a negative capacitance.

10. The AAMC of claim 1 wherein the cavity and the crossed slot provide a dual-polarized response.

11. The AAMC of claim 2 further comprising:
   at least two reactive tuning elements coupled across the crossed slot.

12. The AAMC of claim 11 wherein:
   the crossed slot divides the top face into first, second, third, and fourth patches; and
   the at least two reactive elements comprise:
      a first reactive element connected across the crossed slot between the first patch and the second patch;
      a second reactive element connected across the crossed slot between the third patch and the fourth patch;
      a third reactive element connected across the crossed slot between the first patch and the third patch; and
      a fourth reactive element connected across the crossed slot between the second patch and the fourth patch;
   wherein the first and second reactive elements are across the crossed slot in an X axis; and
   wherein the third and fourth reactive elements are across the crossed slot in a y axis.

13. The AAMC of claim 12 wherein the first, second, third and fourth reactive tuning elements are Non-Foster circuits.

14. The AAMC of claim 13 wherein each Non-Foster circuit comprises a negative inductance or a negative capacitance.

15. The AAMC of claim 11 wherein:
   the crossed slot divides the top face into a first, second, third, and fourth patches, each patch having a corner near a junction of the crossed slot; and the at least two reactive elements comprise:
   a first terminal of a first reactive element connected near the corner of the first patch;
   a first terminal of a second reactive element connected near the corner of the second patch;
   a first terminal of a third reactive element connected near the corner of the third patch; and
   a first terminal of a fourth reactive element connected near the corner of the fourth patch; and
   wherein a second terminal of each of the first, second, third and fourth reactive elements are connected together.

16. The AAMC of claim 15 wherein the first, second, third and fourth reactive tuning elements are Non-Foster circuits.

17. The AAMC of claim 16 wherein each Non-Foster circuit comprises a negative inductance or a negative capacitance.

18. The AAMC of claim 11 wherein:
the crossed slot divides the top face into a first, second, third, and fourth patches, each patch having a corner near a junction of the crossed slot; and
the at least two reactive elements comprise:
   a first terminal of a first reactive element connected near the corner of the first patch;
   a second terminal of the first reactive element connected near the corner of the fourth patch;
   a first terminal of a second reactive element connected near the corner of the second patch;
   a second terminal of the second reactive element connected near the corner of the third patch;
wherein the corner of the first patch is diagonally across the junction of the crossed slot from the corner of the fourth patch; and
wherein the corner of the second patch is diagonally across the junction of the crossed slot from the corner of the third patch.

19. The AAMC of claim 18 wherein the first and second reactive tuning elements are Non-Foster circuits.

20. The AAMC of claim 19 wherein each Non-Foster circuit comprises a negative inductance or a negative capacitance.

21. An active artificial magnetic conductor (AAMC) comprising:
an array of unit cells, each unit cell comprising:
   a square top face having first, second, third and fourth edges;
   a first wall coupled to the first edge of the top face;
   a second wall coupled to the second edge of the top face;
   a third wall coupled to the third edge of the top face;
   a fourth wall coupled to the fourth edge of the top face;
   a base coupled to the first, second, third and fourth walls; and
   a crossed slot in the top face, the crossed slot extending to each of the four edges of the top face dividing the top face into four patches;
wherein the first wall, the second wall, the third wall and the fourth wall are each a continuous wall between the top face and the base;
wherein the top face, the first, second, third and fourth walls, and the base form a cavity inside the top face, the first, second, third and fourth walls; and
wherein the four patches, the first, second, third and fourth walls, and the base are conductive.

22. The AAMC of claim 21 further comprising:
a material filling the cavity, the material comprising air, a dielectric material, or a magnetic material.

23. The AAMC of claim 21:
wherein the crossed slot divides the top face into first, second, third, and fourth patches; and
wherein the AAMC further comprises:
   a first reactive element connected across the crossed slot between the first patch and the second patch;
   a second reactive element connected across the crossed slot between the third patch and the fourth patch;
   a third reactive element connected across the crossed slot between the first patch and the third patch; and
   a fourth reactive element connected across the crossed slot between the second patch and the fourth patch;
wherein the first and second reactive elements are across the crossed slot in an X axis; and
wherein the third and fourth reactive elements are across the crossed slot in a y axis.

24. The AAMC of claim 21:
wherein the crossed slot divides the top face into a first, second, third, and fourth patches, each patch having a corner near a junction of the crossed slot; and
the AAMC further comprises:
   a first terminal of a first reactive element connected near the corner of the first patch;
   a first terminal of a second reactive element connected near the corner of the second patch;
   a first terminal of a third reactive element connected near the corner of the third patch; and
   a first terminal of a fourth reactive element connected near the corner of the fourth patch; and
   wherein a second terminal of each of the first, second, third and fourth reactive elements are connected together.

25. The AAMC of claim 21:
wherein the crossed slot divides the top face into a first, second, third, and fourth patches, each patch having a corner near a junction of the crossed slot; and
the AAMC further comprises:
   a first terminal of a first reactive element connected near the corner of the first patch;
   a second terminal of the first reactive element connected near the corner of the fourth patch;
   a first terminal of a second reactive element connected near the corner of the second patch;
   a second terminal of the second reactive element connected near the corner of the third patch;
wherein the corner of the first patch is diagonally across a junction of the crossed slot from the corner of the fourth patch; and
wherein the corner of the second patch is diagonally across a junction of the crossed slot from the corner of the third patch.

26. The AAMC of claim 21 wherein:
each unit cell is symmetric about an x-z and about a y-z axis; and
the top face is planar.

27. The AAMC of claim 21 wherein:
the cavity has a square cross section of size slightly less than a period of repetition of the unit cells in the array of unit cells.

* * * * *